United States Patent
Railkar et al.

(10) Patent No.: US 9,559,034 B2
(45) Date of Patent: Jan. 31, 2017

(54) PACKAGE FOR HIGH-POWER SEMICONDUCTOR DEVICES

(71) Applicant: TriQuint Semiconductor, Inc., Hillsboro, OR (US)

(72) Inventors: Tarak A. Railkar, Plano, TX (US); Deep C. Dumka, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 143 days.

(21) Appl. No.: 14/580,147

(22) Filed: Dec. 22, 2014

(65) Prior Publication Data

US 2015/0104906 A1    Apr. 16, 2015
US 2016/0155681 A9    Jun. 2, 2016

Related U.S. Application Data

(62) Division of application No. 13/769,729, filed on Feb. 18, 2013, now Pat. No. 8,946,894.

(51) Int. Cl.
H01L 21/44    (2006.01)
H01L 23/34    (2006.01)
H01L 21/78    (2006.01)
H01L 21/48    (2006.01)
H01L 23/00    (2006.01)
H01L 23/373   (2006.01)

(52) U.S. Cl.
CPC .......... *H01L 23/34* (2013.01); *H01L 21/4882* (2013.01); *H01L 21/78* (2013.01); *H01L 23/3735* (2013.01); *H01L 24/83* (2013.01); *H01L 23/373* (2013.01); *H01L 23/3731* (2013.01); *H01L 23/3732* (2013.01); *H01L 23/3736* (2013.01); *H01L 2924/0002* (2013.01); *H01L 2924/01322* (2013.01); *H01L 2924/12042* (2013.01)

(58) Field of Classification Search
CPC ............ H01L 21/4882; H01L 21/0228; H01L 23/345; H01L 23/53219; H01L 23/53233; H01L 23/488; H01L 23/3114
USPC .............. 438/680, 687, 688, 602, 603, 604; 257/E21.066, E21.077, E21.085, E21.17, 257/E21.126, E21.127, E21.128, E21.129, 257/E21.267, E21.459, E21.497
See application file for complete search history.

(56) References Cited

U.S. PATENT DOCUMENTS

| | | | |
|---|---|---|---|
| 6,617,683 B2 * | 9/2003 | Lebonheur | H01L 23/433 257/707 |
| 6,709,895 B1 | 3/2004 | Distefano | |
| 6,972,495 B2 | 12/2005 | Fjelstad | |
| 7,078,109 B2 | 7/2006 | Hill | |
| 7,446,410 B2 * | 11/2008 | Wehrly, Jr. | H05K 1/189 257/707 |
| 7,579,687 B2 * | 8/2009 | Szewerenko | G06F 1/20 257/707 |
| 7,719,816 B2 | 5/2010 | Karavakis | |

(Continued)

OTHER PUBLICATIONS

Quayle Action for U.S. Appl. No. 13/769,729, mailed Jul. 9, 2014, 4 pages.

(Continued)

*Primary Examiner* — David Nhu
(74) *Attorney, Agent, or Firm* — Withrow & Terranova, P.L.L.C.

(57) ABSTRACT

Methods and apparatuses for forming a package for high-power semiconductor devices are disclosed herein. A package may include a plurality of distinct thermal spreader layers disposed between a die and a metal carrier. Other embodiments are described and claimed.

14 Claims, 6 Drawing Sheets

(56) References Cited

U.S. PATENT DOCUMENTS 7,959,325 B2 * 6/2011 Roberts ............ G02F 1/133603
362/240

OTHER PUBLICATIONS

Notice of Allowance for U.S. Appl. No. 13/769,729, mailed Sep. 24, 2014, 7 pages.
Railkar, Tarak A., et al; "A Critical Review of Chemical Vapor-Deposited (CVD) Diamond for Electronic Applications;" Critical Reviews in Solid State and Materials Sciences, vol. 25 / Issue 3 / pp. 163-277; CRC Press, Inc.; 2000.

* cited by examiner

PACKAGE FOR HIGH-POWER SEMICONDUCTOR DEVICES

The present application is a divisional application of U.S. patent application Ser. No. 13/769,729, filed Feb. 18, 2013, now U.S. Pat. No. 8,946,894 B2, entitled "Package for High-Power Semiconductor Devices," the disclosure of which is hereby incorporated by reference in its entirety for all purposes.

TECHNICAL FIELD

Embodiments of the present invention relate generally to microelectronic devices including packages for high-power semiconductor devices.

BACKGROUND

In the current state of technology, there has been an increased demand for devices with high power density. The requirements for devices such as microwave- and millimeter-wave devices, for example, are becoming increasingly stringent. To accommodate such demands, gallium nitride technology has been used with favorable results. Problematic, however, is the heat output with the high power densities associated with gallium nitride.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

For the purposes of the present invention, the phrase "A or B" means "(A), (B), or (A and B)."

Various embodiments of the present invention are directed to methods and apparatuses for forming a package for high-power semiconductor devices. In particular, in accordance with some embodiments, a package is taught that includes a plurality of distinct thermal spreader layers disposed between a die and a metal carrier. Relative to various methods known in the related art, these embodiments may decrease thermal resistance between dies and a heat sink. These embodiments may additionally or alternatively reduce the presence or severity of localized hot spots that may be associated with areas of the die that have relatively higher power densities.

Figure 1:
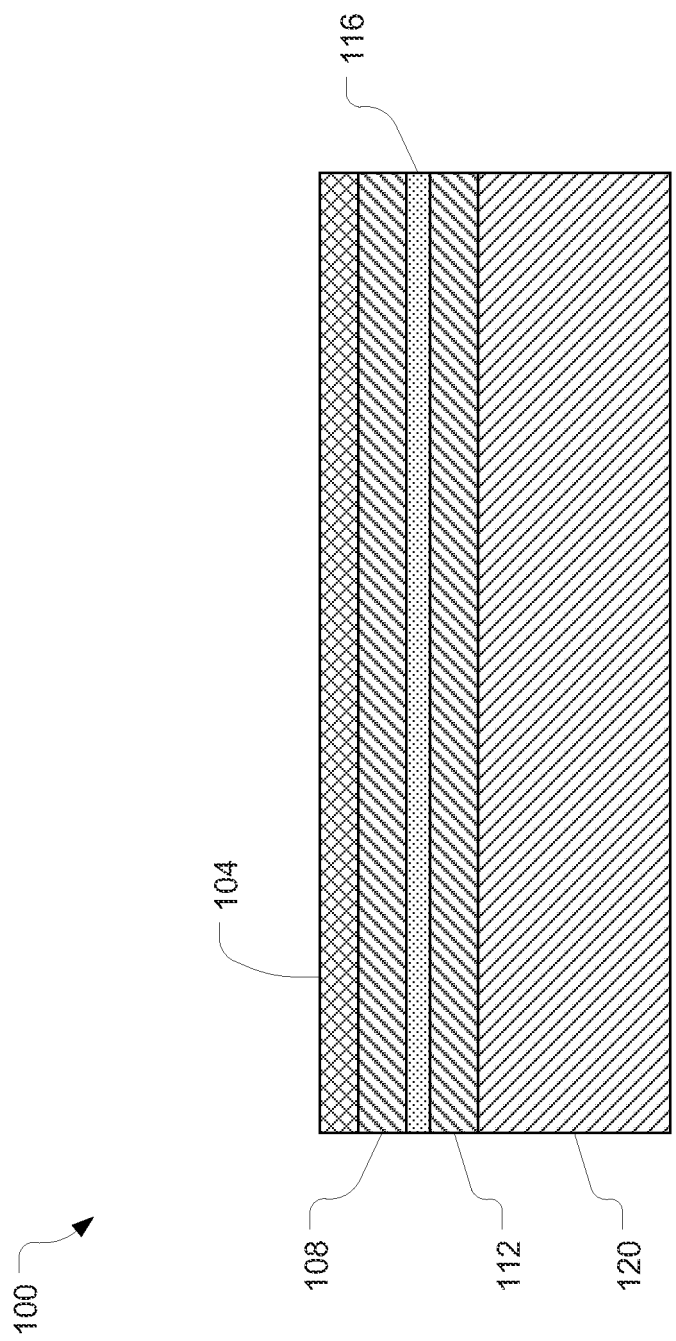
FIG. 1 illustrates a package in accordance with various embodiments of the present invention.

FIG. 1 illustrates a package 100 in accordance with some embodiments. The package 100 may include a die 104 coupled with a thermal spreader layer 108. The thermal spreader layer 108 may be coupled with a thermal spreader layer 112 by an adhesive 116. The thermal spreader layer 112 may be further coupled with a metal carrier 120.

The die 104 may be made of a semiconductor material such as gallium nitride (GaN). GaN has a high bandgap relative to other semiconductor materials and, therefore, may operate at relatively higher voltages and provide relatively higher power densities. Devices utilizing GaN dies, e.g., GaN high electron mobility transistors (HEMT) devices, may be used in power management, power amplification, or other high-power applications. Effective management of thermal energy sourced from these GaN dies in these high-power applications may provide a corresponding increase in performance or longevity of the devices. While embodiments describe the die 104 as a GaN die, the dies of other embodiments may include other semiconductor materials such as, but not limited to, gallium arsenide (GaAs), indium phosphide (InP), or silicon.

As will be readily understood in the art, the schematic of FIG. 1 is not shown to scale. In some embodiments, the thicknesses of the components of the package 100 may be as follows. The die 104 may be approximately 1-5 microns thick; the thermal spreader layer 108 may be approximately 25-500 microns thick; the thermal spreader layer 112 may be approximately 25-500 microns thick; and the metal carrier may be approximately 100-2000 microns thick.

The thermal spreader layers may be composed of materials having high thermal conductivity to facilitate rapid distribution of thermal energy sourced from the dies 104 during operation. Materials having suitably high thermal conductivity include diamond (thermal conductivity of about 700-2000 Watts per meter Kelvin (W/m·K)), aluminum nitride (AlN) (thermal conductivity of up to about 300 W/m·K), polycrystalline silicon carbide (poly-SiC) (thermal conductivity of greater than 300 W/m·K, carbon nanofibers (thermal conductivity of 800-2000 or more W/m·K), etc.

The adhesive 116 may be a thermally conductive adhesive such as, but not limited to, eutectic alloys like gold-tin, gold-germanium, gold-silicon, etc., or epoxies like sintered silver, sintered copper, etc. The thermal spreader layers and the adhesive 116 may provide a channel with a low thermal resistance so that thermal energy may be rapidly transferred from a heat source, for example, the die 104, to a heat sink, for example, the metal carrier 120.

The metal carrier 120 may be a thermally conductive material that has sufficient bulk and thermal properties to store and gradually dissipate absorbed thermal energy. In various embodiments, the metal carrier 120 may include a metal or metal alloys such as, but not limited to, copper, aluminum, copper-moly, copper-tungsten, aluminum-silicon carbide, etc.

The use of the double layer thermal spreaders, as shown, provides a number of manufacturing efficiencies, as will be discussed below, as well as various operating efficiencies. For example, the close proximity of the thermal spreaders to a heat sink, for example, metal carrier 120, may assist with efficient removal of unwanted heat away from the semiconductor device channel of the die 104. The structure of the package 100 may work to reduce total thermal resistance in the channel from the die 104 to the metal carrier 120, as well as reduce the risk of hot-spots on the die 104.

While embodiments describe the use of two thermal spreader layers, other embodiments may include additional thermal spreader layers. Adhesive layers may be disposed between the different thermal spreader layers.

While not specifically shown, the package 100 may be further packaged for wire-bonding and routing or assembled directly on a printed circuit board, e.g., a motherboard, a daughterboard, an application board, etc.

Figure 2:
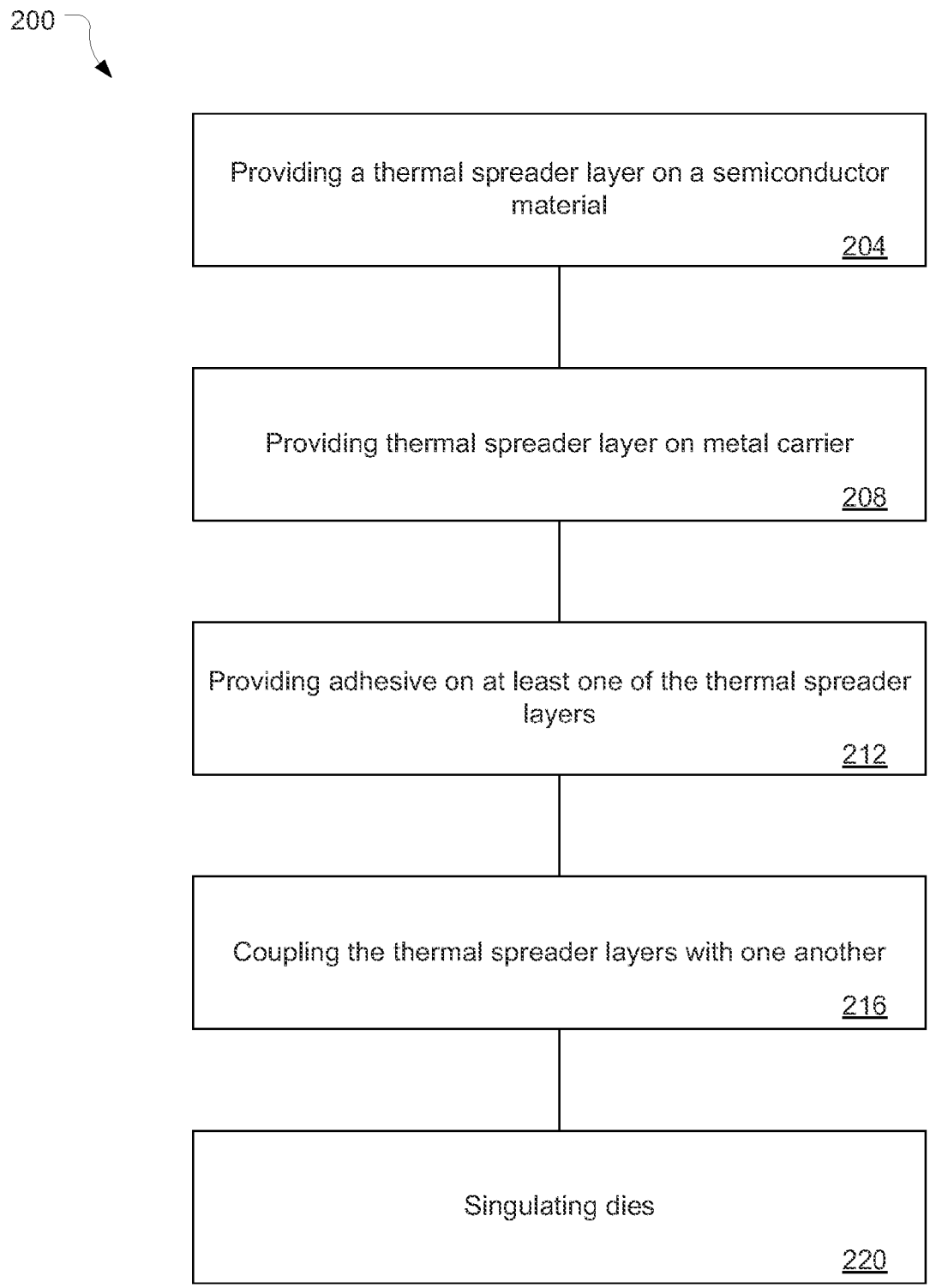
FIG. 2 is a flowchart depicting operations of manufacturing a package in accordance with various embodiments of the present invention.

FIG. 2 is a flowchart depicting an operation 200 to manufacture a package, for example, package 100, in accordance with some embodiments. FIG. 3 is a schematic that corresponds to the operation 200 in accordance with some embodiments. At 204 and FIG. 3(a), the operation 200 may include providing a thermal spreader layer 308 on a semiconductor material 304. The semiconductor material 304 may be, for example, GaN and the thermal spreader layer 308 may be, for example, diamond.

The providing at 204 may include forming the thermal spreader layer 308 on the semiconductor material 304 or vice versa. Forming a layer on another layer may include any type of formation process including, but not limited to, growing, depositing, coupling, etc. In some embodiments, the forming may include a chemical vapor deposition (CVD) process. A CVD process may be especially useful in forming a diamond thermal spreader layer. In embodiments in which a thermal spreader layer includes diamond formed from a CVD process, it may also be referred to as a CVD diamond thermal spreader layer.

Figure 3A:
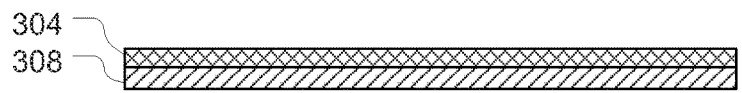
FIGS. 3(a), 3(b), 3(c), 3(d), and 3(e) illustrate a schematic of manufacturing operations of a package in accordance with various embodiments of the present invention.
Figure 3B:
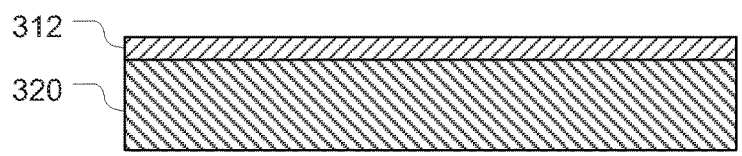

The operation 200 may further include, at 208 and FIG. 3(b), providing a thermal spreader layer 312 on a metal carrier 320. The providing at 208 may be similar to, or different from, the providing at 204. For example, the providing at 208 may include forming the thermal spreader layer 312 on the metal carrier 320 or vice versa.

In some embodiments, the formation of the thermal spreader may depend on characteristics of the underlying substrate. For example, formation of the thermal spreader layer 308 on the semiconductor material 304 may vary from the formation of the thermal spreader layer 312 on the metal carrier 320 due to varying characteristics of the semiconductor material 304 and the metal carrier 320. In this manner, the two formation processes may be independently improved.

Figure 3C:
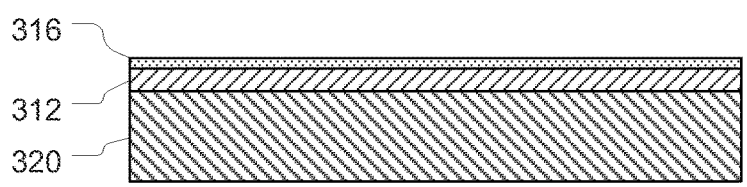

The operation 200 may further include, at 212 and FIG. 3(c), providing an adhesive layer 316 on the thermal spreader layer 308 or the thermal spreader layer 312. In FIG. 3(c), the adhesive layer 316 is shown on the thermal spreader layer 312; however, in other embodiments, it may be provided in alternative or additional places, such as, for example, on the thermal spreader layer 308.

Figure 3D:
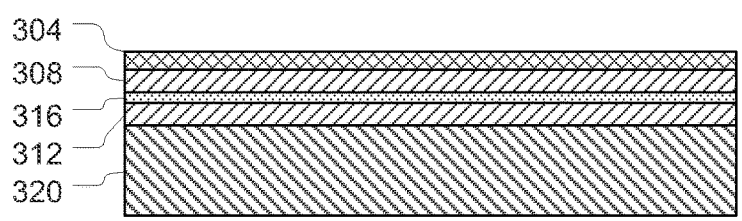

The operation 200 may further include, at 216 and FIG. 3(d), coupling the thermal spreader layer 308 (and the semiconductor material on which it is disposed) with the thermal spreader layer 312 (and the metal carrier on which it is disposed). The coupling of 216 may include placing the thermal spreader layer 308 against the adhesive layer 316 and the thermal spreader layer 312 and curing the adhesive layer 316. The curing of the adhesive layer 316 may include application of appropriate amounts of heat and/or pressure.

Figure 3E:
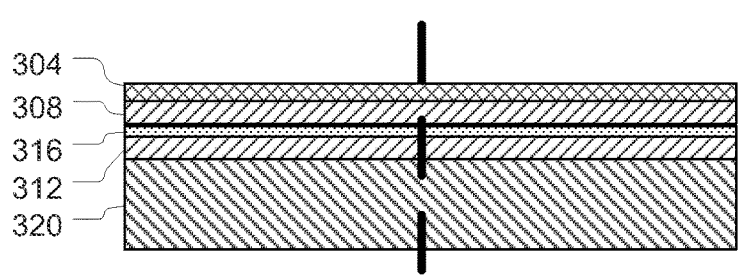

The operation 200 may further include, at 220 and FIG. 3(e), singulating dies. The singulation of the dies at 220 may be performed by using mechanical dicing (for example, saw, scribe and break, etc.), laser sawing, plasma dicing, plasma and mechanical hybrid dicing, etc.

Figure 4:
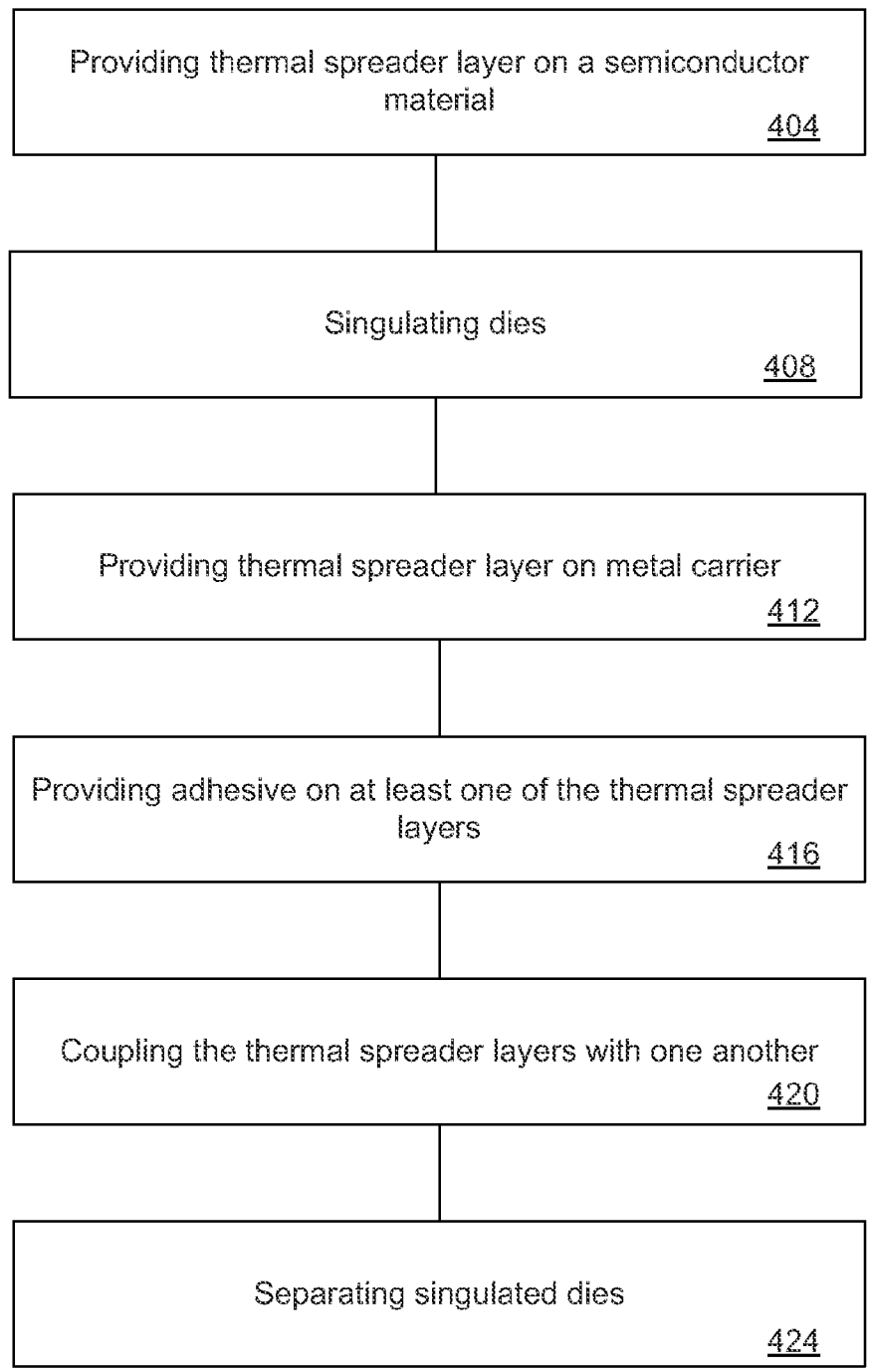
FIG. 4 is a flowchart depicting operations of manufacturing a package in accordance with various embodiments of the present invention.

FIG. 4 is a flowchart depicting an operation 400 to manufacture a package, for example, package 100, in accordance with some embodiments. FIG. 5 is a schematic that corresponds to the operation 400 in accordance with some embodiments. The operation 400 may be similar to operation 200 except as otherwise noted.

Figure 5A:
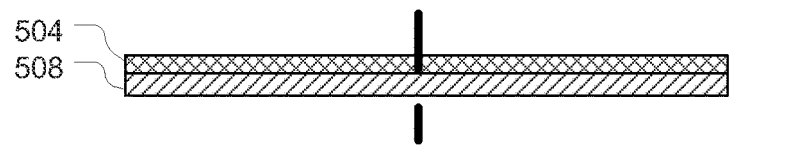
FIGS. 5(a), 5(b), 5(c), 5(d), 5(e), and 5(f) illustrate a schematic of manufacturing operations of a package in accordance with various embodiments of the present invention.

At 404 and FIG. 5(a), the operation 400 may include providing a thermal spreader layer 508 on a semiconductor material 504, such as a GaN wafer.

Figure 5B:
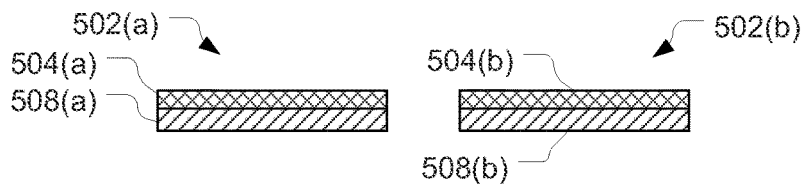

The operation 400 may further include, at 408 and FIG. 5(b), singulating dies 502(a) and 502(b). Die 502(a) may include a semiconductor portion 504(a) and a thermal spreader portion 508(a). Similarly, die 502(b) may include a semiconductor portion 504(b) and a thermal spreader portion 508(b).

Figure 5C:
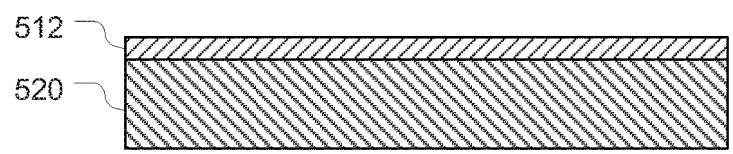

The operation 400 may further include, at 412 and FIG. 5(c), providing thermal spreader layer 512 on metal carrier 520.

Figure 5D:
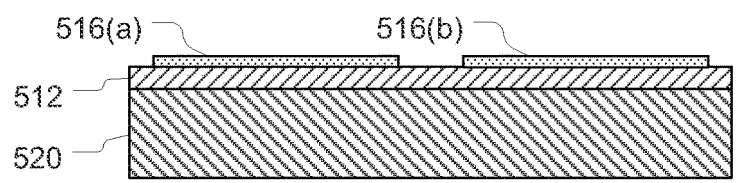

The operation 400 may further include, at 416 and FIG. 5(d), providing an adhesive layer 516 on the thermal spreader layer 512. In some embodiments, the adhesive layer 516 may be provided on the thermal spreader layer 512 as a pattern including adhesive portions 516(a) and 516(b). In some embodiments, the thermal spreader layer 512 may be patterned by use of a screen or a mask.

Figure 5E:
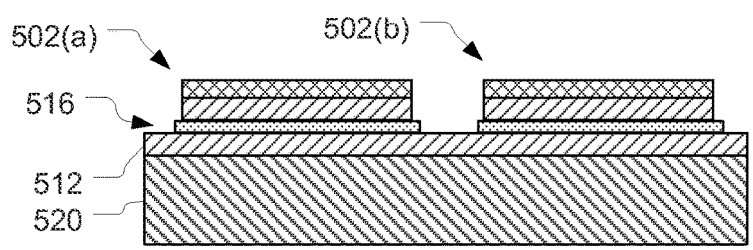

The operation 400 may further include, at 420 and FIG. 5(e), coupling the dies 502 with the thermal spreader layer 512 (and the metal carrier on which it is disposed). This may include a pick-and-place process to place the dies 502 on the appropriate adhesive portions. Subsequently, the adhesive portions may be cured to securely couple the dies 502 with the thermal spreader layer 512.

Figure 5F:
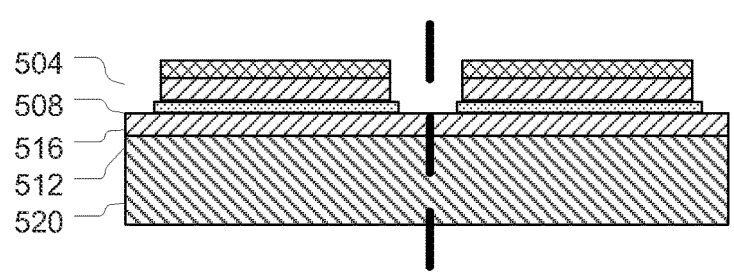

The operation 400 may further include, at 424 and FIG. 5(f), separating the singulated dies. The separation of the singulated dies at 424 may be performed by processes similar to singulation processes used to singulate the dies at 408. However, the separation operation may be less precise in nature allowing for use of cheaper and faster separating processes.

The die-based processing of operation 400 may be associated with higher yields than the wafer-based processing of operation 200, though it may also be associated with an extra separation process. The higher yields of operation 400 may be provided due to the fact that only the dies that meet certain operating criteria, rather than the wafer as a whole, may be further processed.

Figure 6:
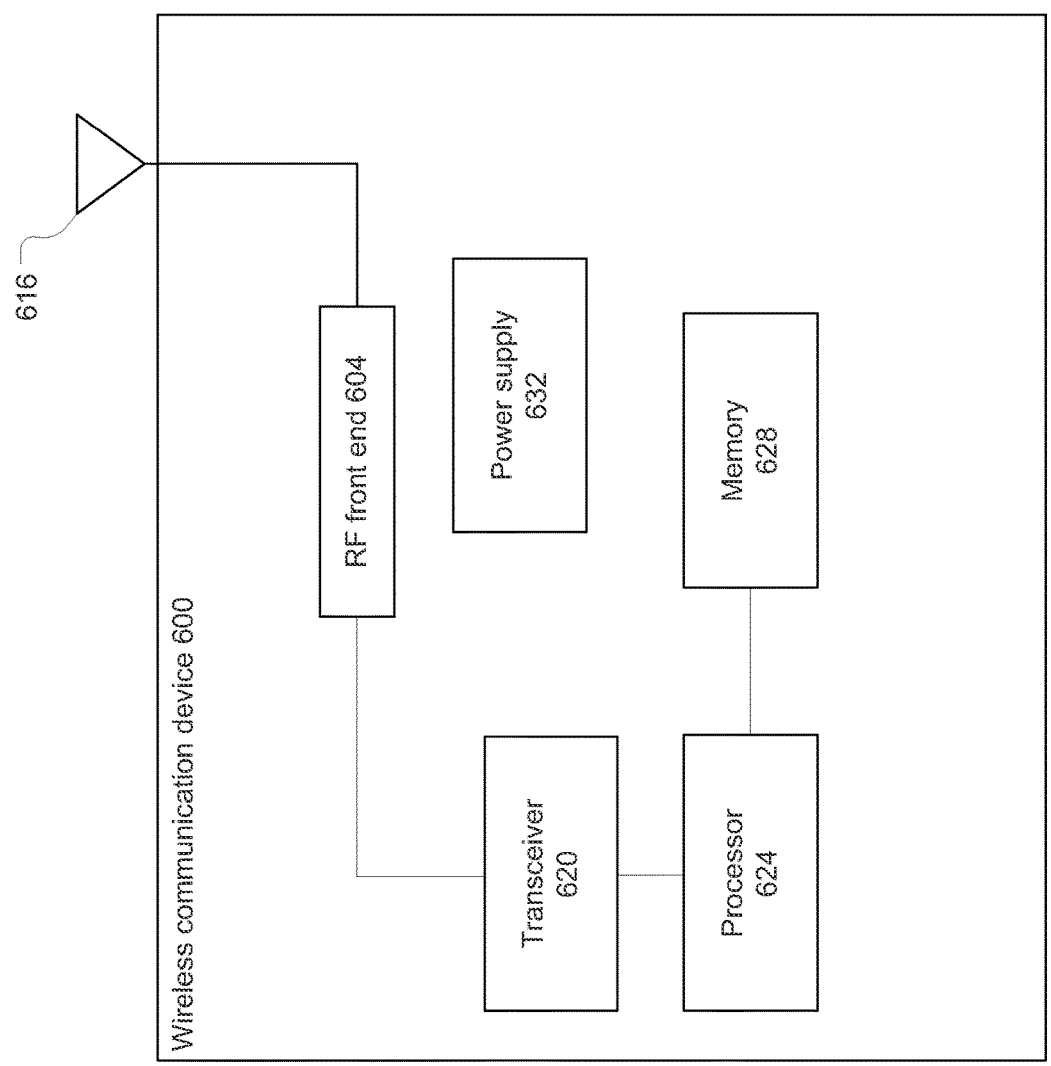
FIG. 6 is a block diagram of an exemplary radio frequency system in accordance with various embodiments.

The packages described herein may be particularly suitable for GaN HEMTs that are incorporated into radio frequency systems for power management or power amplification at various frequencies, for example, microwave and/or millimeter wave frequencies. FIG. 6 is a block diagram of a RF system 600 in accordance with various embodiments. The RF system 600 may be a wireless communication device that has an RF front-end 604 that includes various components to facilitate transmission or reception of RF signals. The components could include, but are not limited to, an antenna switch module, a transmitter, a receiver, an amplifier, a converter, a filter, etc.

In addition to the RF front-end 604, the RF system 600 may have an antenna 616, a transceiver 620, a processor 624, and a memory 628 coupled with each other at least as shown. The RF system 600 may further include a power supply 632 coupled to one or more of the other components to provide appropriate power supplies. In various embodiments, GaN HEMTs (or other devices) packaged in accordance the present teachings may be employed in a power management application of the power supply 632, an amplification application of the RF front-end 604, or other application.

The processor 624 may execute a basic operating system program, stored in the memory 628, in order to control the overall operation of the wireless communication device 600. For example, the processor 624 may control the reception of signals and the transmission of signals by the transceiver 620. The processor 624 may be capable of executing other processes and programs resident in the memory 628 and may move data into or out of the memory 628 as desired by an executing process.

The transceiver 620 may receive outgoing data (e.g., voice data, web data, e-mail data, signaling data, etc.) from the processor 624, may generate RF signal(s) to represent the outgoing data, and provide the RF signal(s) to the RF front-end 604. Conversely, the transceiver 620 may receive RF signals from the RF front-end 604 that represent incoming data. The transceiver 620 may process the RF signals and send incoming signals to the processor 624 for further processing.

The RF front-end 604 may provide various front-end functionality. The front-end functionality may include, but is not limited to, switching, amplifying, filtering, converting, etc.

In various embodiments, the antenna 616 may include one or more directional and/or omnidirectional antennas, including a dipole antenna, a monopole antenna, a patch antenna, a loop antenna, a microstrip antenna, or any other type of antenna suitable for transmission and/or reception of RF signals.

In various embodiments, the wireless communication device 600 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the RF system 600 is given by way of example and that, for simplicity and clarity, only so much of the construction and operation of the RF system 600 as is necessary for an understanding of the embodiments is shown and described. Various embodiments contemplate any suitable component or combination of components performing any suitable tasks in association with the RF system 600, according to particular needs. Moreover, it is understood that the RF system 600 should not be construed to limit the types of devices in which embodiments may be implemented.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method of forming a package for high power semiconductor devices, the method comprising:
   providing a first thermal spreader layer on a semiconductor material;
   providing a second thermal spreader layer on a metal carrier; and
   coupling the first thermal spreader layer to the second thermal spreader layer with an adhesive, wherein the first thermal spreader layer and the second thermal spreader layer are sandwiched between the semiconductor material and the metal carrier.

2. The method of claim 1, wherein the semiconductor material comprises gallium nitride.

3. The method of claim 1, wherein said providing of the first thermal spreader layer comprises:
   forming the first thermal spreader layer on a wafer of the semiconductor material.

4. The method of claim 3, further comprising:
   singulating dies from the wafer after said coupling of the first thermal spreader layer with the second thermal spreader layer.

5. The method of claim 3, further comprising:
   singulating dies from the wafer prior to said coupling of the first thermal spreader layer with the second thermal spreader layer.

6. The method of claim 3, wherein said providing of the adhesive further comprises:
   printing a pattern of the adhesive on the second thermal spreader layer.

7. The method of claim 1, wherein said providing of the first thermal spreader layer comprises:
   forming the second thermal spreader layer on individual dies of the semiconductor material.

8. The method of claim 7, further comprising:
   placing the individual dies and formed second thermal spreader layer on the first thermal spreader layer formed on the metal carrier.

9. The method of claim 1, wherein the first and second thermal spreader layers comprise silicon carbide, diamond, or aluminum nitride.

10. The method of claim 1, wherein the first and second thermal spreader layers comprise diamond and are formed by chemical vapor deposition.

11. The method of claim 1, wherein the adhesive is a sintered silver or sintered copper.

12. The method of claim 1, wherein said coupling of the first thermal layer with the second thermal layer comprises:
placing the first and second thermal layers adjacent to one another and curing the adhesive.

13. The method of claim 1, wherein the metal carrier comprises copper or aluminum.

14. The method of claim 1, wherein said providing of the first spreader layer comprises forming the first spreader layer to a thickness between 25 and 500 microns; and said forming of the second spreader layer comprises forming the second spreader layer to a thickness between 25 and 500 microns.

* * * * *